United States Patent [19]

Rall et al.

[11] Patent Number: 5,611,697

[45] Date of Patent: Mar. 18, 1997

[54] CONNECTOR MODULE WITH MOLDED UPPER SECTION INCLUDING MOLDED SOCKET, SOCKET PINS, AND POSITIONING ELEMENTS

[75] Inventors: David W. Rall, Webster; Timothy M. Minerd, Pittsford, both of N.Y.

[73] Assignee: Xerox Corporation, Stamford, Conn.

[21] Appl. No.: 515,780

[22] Filed: Aug. 16, 1995

[51] Int. Cl.⁶ .................................................. H01R 29/00
[52] U.S. Cl. ............................................ 439/71; 439/925
[58] Field of Search .................................. 439/66, 68, 71, 439/925, 925.1, 52, 69, 77

[56] References Cited

U.S. PATENT DOCUMENTS

| | | | |
|---|---|---|---|
| 4,508,399 | 4/1985 | Dowling et al. | 439/925 |
| 4,727,456 | 2/1988 | Mehta et al. | 439/71 |
| 5,037,308 | 8/1991 | Bryce | 439/52 |
| 5,044,964 | 9/1991 | Minerd et al. | 439/67 |
| 5,104,327 | 4/1992 | Walburn | 439/71 |
| 5,125,846 | 6/1992 | Sampson | 439/66 |
| 5,181,852 | 1/1993 | Dambach et al. | 439/66 |
| 5,299,942 | 4/1994 | Burke et al. | 439/925 |
| 5,415,556 | 5/1995 | Schroll | 439/925 |
| 5,452,183 | 9/1995 | Renn et al. | 439/66 |

Primary Examiner—Neil Abrams
Assistant Examiner—Brian J. Biggi
Attorney, Agent, or Firm—Ronald F. Chapuran

[57] ABSTRACT

An interface connector device having two assemblies for interconnecting a plurality of input/output devices to a multi-wire bus. The first assembly is electrically connected directly to the multi-wire bus and the second is carried on the first assembly and supports an IC chip. The second assembly includes electrical connections for connecting the input and output devices to the IC chip and for connecting the multi-wire bus to the IC chip for conveying the signals between the multi-wire bus and the input and output devices. The second assembly incorporates a single molded piece including a molded socket for receiving the IC chip, a set of molded pins adapted to receive conductive coatings for electrically connecting the input and output devices to the IC chip, and molded positioning elements for orienting the second assembly with respect to the first assembly.

20 Claims, 3 Drawing Sheets

CONNECTOR MODULE WITH MOLDED UPPER SECTION INCLUDING MOLDED SOCKET, SOCKET PINS, AND POSITIONING ELEMENTS

BACKGROUND OF THE INVENTION

The invention relates to an integrated input/output interface connector module, and more particularly, to a connector module that includes a single, molded upper section incorporating a molded socket, molded socket pins, and molded positioning elements It is well known in the prior art that connectors have a logic chip or circuitry within the connector itself. For example, U.S. Pat. No. 4,420,794 discloses a device carrying an integrated circuit chip that permits connecting the chip into a circuit board. In addition, U.S. Pat. No. 5,037,308 discloses a two stage connector module having a chip carrier with mechanisms for securing the chip carrier to a molded base. In particular, the chip carrier is snap fitted into a molded plastic base to interface with a multi-wire bus by means of spring contacts in the base. Another two stage connector device disclosed in U.S. Pat. No. 5,125,846 shows a common housing that can be used to electrically couple either discreet insulated conductor wires or surface connectors to an electronic component.

A difficulty with the prior art devices is often a relatively complex process in the fabrication, alignment and interconnection of various parts that make up the connector device. Even in those devices having an essentially two piece assembly, current chip mounted connector upper assemblies include four parts: a printed wiring board, two I/O connectors, and an IC chip. In addition, there is a main housing adapted for attachment to a multi-wire bus. The upper or chip carrying assembly requires chip circuit conductive traces and pins for interconnecting to input output devices. The fabrication process involves many steps. For example, the assembly process may require the placement and soldering of a chip on a printed wiring board followed by the placement of soldered input/output connectors. All these process steps include the placement and critical alignment of component parts.

It would be desirable, therefore, to overcome many of the above difficulties, in particular, to be able to minimize manufacturing and processing steps in the fabrication of a connector housing and integrated circuit chip assembly. For example, it would be desirable to reduce discrete parts, and enable easy alignment, orientation, and mechanical fitting of the component parts.

It is a object of the present invention, therefore, to eliminate discrete parts in the fabrication of a connector housing and integrated circuit chip assembly. Another object of the present invention is to eliminate soldering, provide a solderless, mechanical snap together assembly, and enable an easy, repairable method in the event of chip failure or reuse of assemblies for other chip configurations. It is another object of the present invention to provide a single molded upper housing assembly that includes a molded socket for the integrated circuit chip, molded pins for interconnection to input output devices, and molded positioning and alignment elements to properly align the upper housing assembly with a lower housing assembly. Still another object of the present invention is to provide a molded upper assembly with molded socket including a polarization feature and interactive conductive elements to enable press fit mounting and electrical connection of the chip in the socket. Still another object of the present invention is to provide a connector device having molded locating features including a substrate having a positioning cavity for locating connector stages in a horizontal direction and elongated cut out strips for locating connector stages in the vertical direction. Further advantages of the present will become apparent as the following description proceeds and the features characterizing the invention will be pointed out with particularity in the claims annexed and forming a part of this specification.

SUMMARY OF THE INVENTION

Briefly, the present invention is an interface connector device having two assemblies for interconnecting a plurality of input/output devices to a multi-wire bus. The first assembly is electrically connected directly to the multi-wire bus and the second is carried on the first assembly and supports an IC chip. The second assembly includes electrical connections for connecting the input and output devices to the IC chip and for connecting the multi-wire bus to the IC chip for conveying the signals between the multi-wire bus and the input and output devices. The second assembly incorporates a single molded piece including a molded socket for receiving the IC chip, a set of molded pins adapted to receive conductive coatings for electrically connecting the input and output devices to the IC chip, and molded positioning elements for orienting the second assembly with respect to the first assembly.

DESCRIPTION OF THE DRAWINGS

For a better understanding of the present invention, reference may be had to the accompanying drawings wherein the same reference numerals have been applied to like parts and wherein.

DETAILED DESCRIPTION OF THE INVENTION

Figure 1:
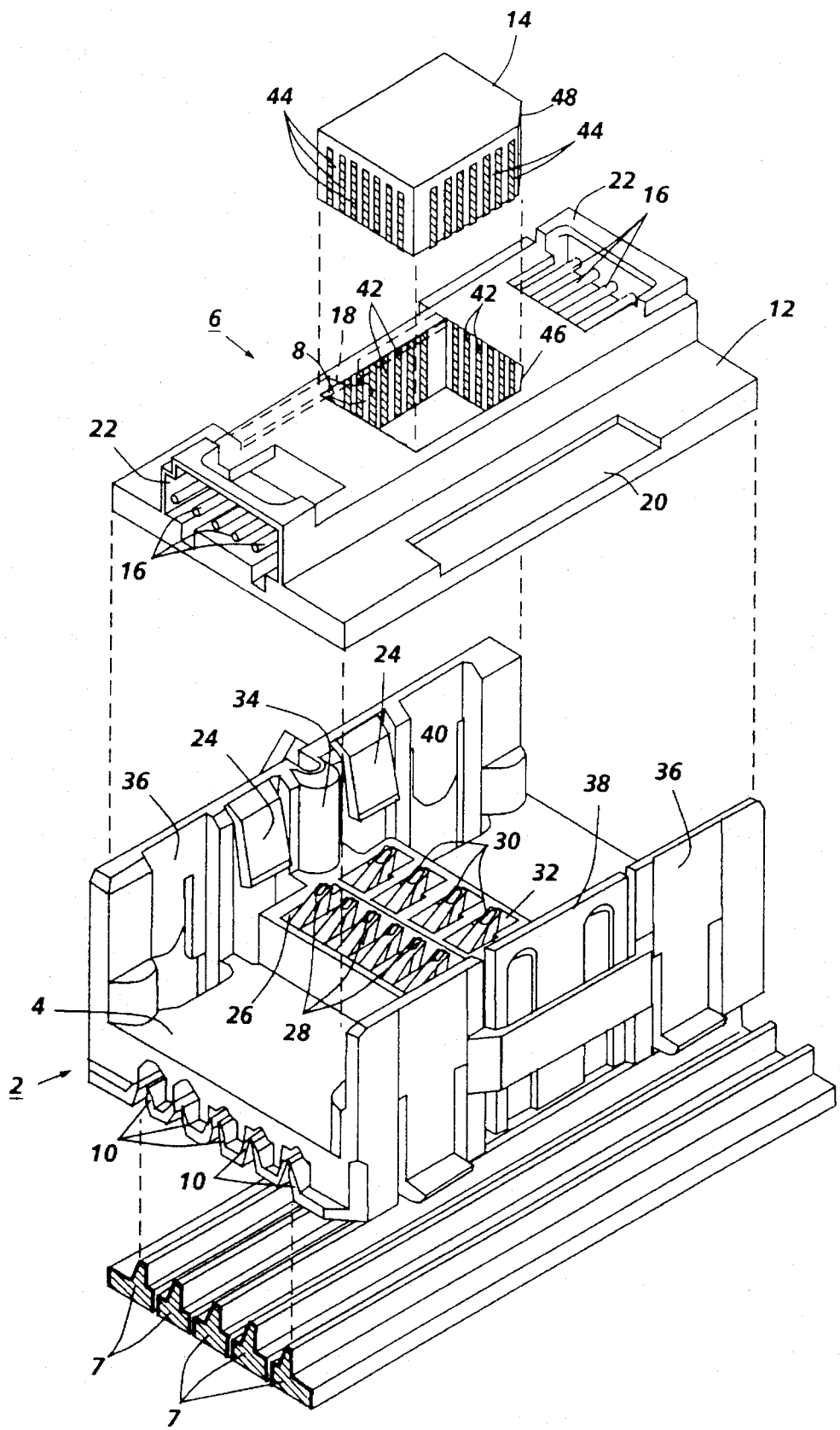
FIG. 1 is an exploded isometric view of a 2 stage connector in accordance with the present invention.
Figure 2:
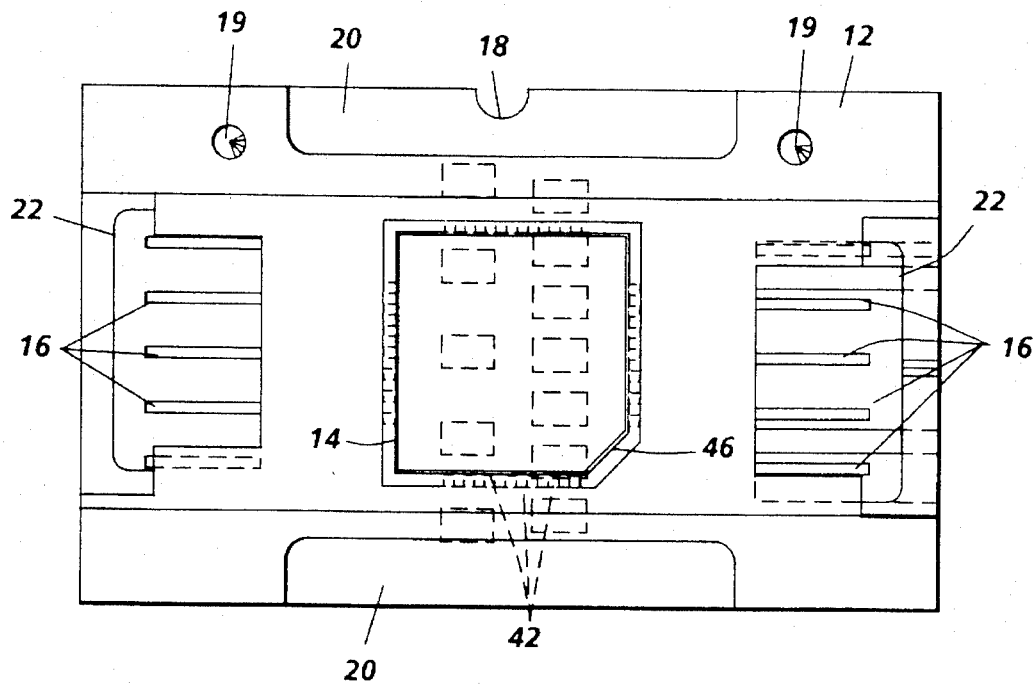
FIG. 2 is a top plan view of the upper stage of the connector in accordance with the present invention.
Figure 3:
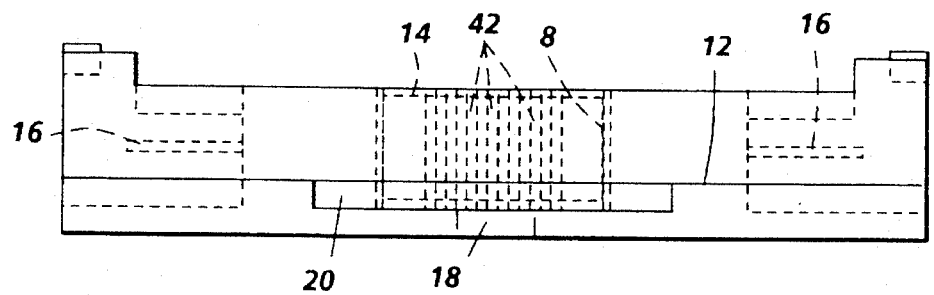
FIG. 3 is a side plan view of the upper stage of the connector in accordance with the present invention.
Figure 4:
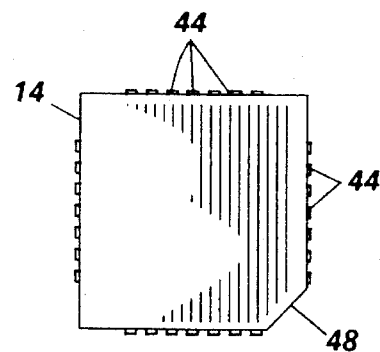
FIG. 4 is an top view of a chip to be mounted in the upper stage of the connector.
Figure 5:
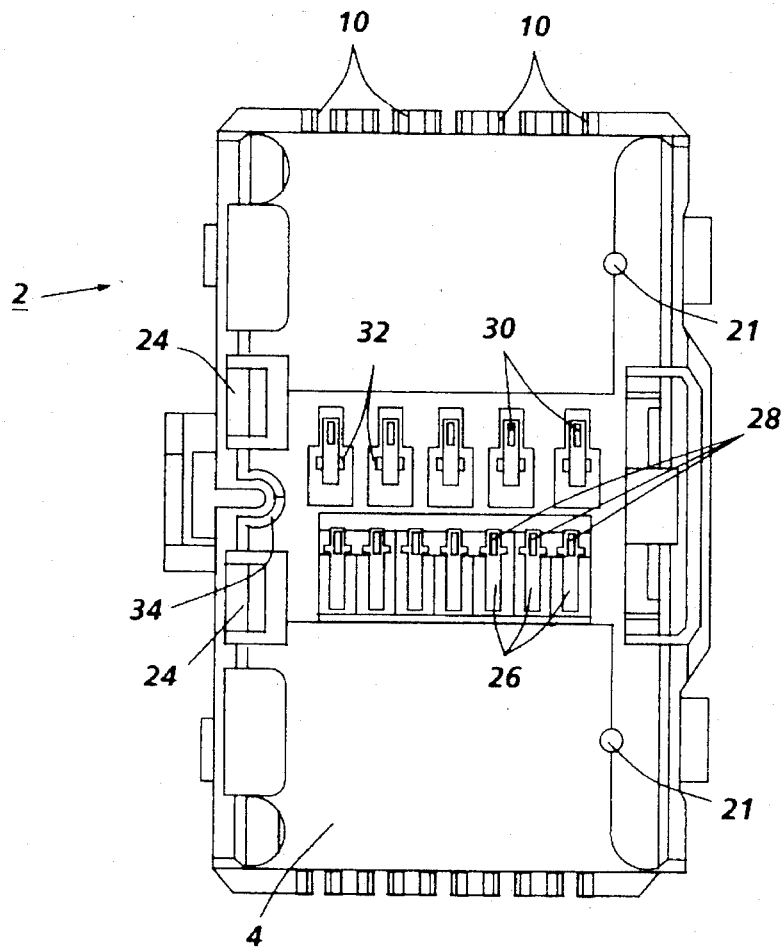
FIG. 5 is a top plan view of the lower stage of the connector of FIG. 1.
Figure 6:
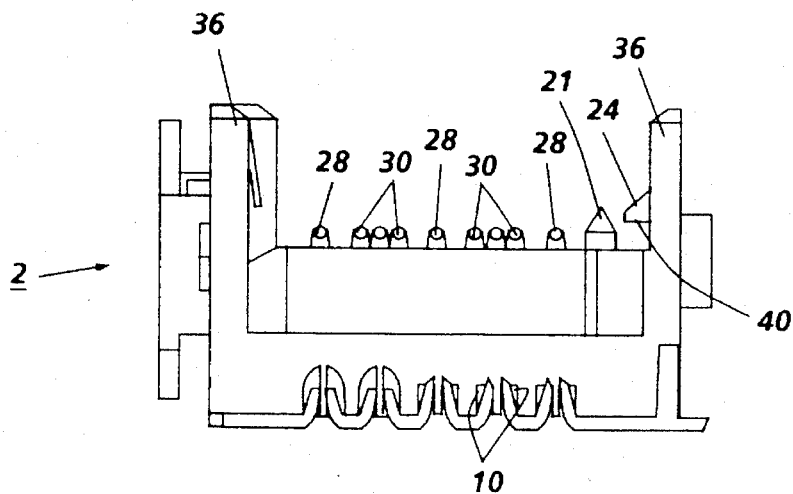
FIG. 6 is an end view of the lower stage of the connector.

FIGS. 1 through 6 illustrate a two-stage module in accordance with the present invention comprising a first stage or lower assembly generally shown at 2 including a molded base 4 and a second stage or molded upper assembly generally shown at 6 including a chip socket 8.

The molded plastic base 4 has a plurality of molded cavities 10 in its bottom interior so as to allow wires or conductors 7 of a 5-wire bus to extend therethrough. Also, as well known in the art, not shown Insulation Displacement Connectors (IDCs) are provided on the bottom of the molded base 4 to direct the wires or conductors 7 of the bus through the cavities of the molded base and further functions as a means for securing the wires of the bus. The IDCs are comprised of relatively sharp metal edges spaced apart so that when the insulated bus wires are inserted into a IDC and pulled through the molded cavities of the base during the harnessing stage of assembly, the insulation is pierced allowing connection directly to the wires.

The conductors 7 represent a serial input data (SID) line, a serial output data (SOD) line, a grounded line, a voltage source line and a clock pulse line Those skilled in the art will realize that the locations of the various lines can be interchanged as warranted without deviating from the teachings of the invention.

Chip socket 8 communicates with a substrate surface 12 to support chip 14 and not shown conductive traces on its underside. In accordance with one feature of the present invention the molded upper assembly 6 includes sets of molded pins, the sets of molded pins 16 including applied conductive coatings for electrically connecting the input and output devices to the IC chip. The molded socket 8 receives the IC chip 14 and the molded positioning elements locate the upper stage with respect to the lower stage in both the horizontal and vertical directions. The upper stage includes the molded substrate 12 having a molded positioning cavity 18 and pin holes 19 for locating the lower stage 2 with respect to the upper stage 6 in the horizontal direction and the surface of the substrate 12 includes cut out portions 20 for locating the lower stage with respect to the upper stage in the vertical direction. The pin holes 19 engage pins 21 shown in FIGS. 5 and 6. The lower stage is adapted for connecting the multi-wire bus to the IC chip for conveying the signals between the multi-wire bus and the input and output devices.

The ends of the molded pins 16 are generally situated in interfacing sockets 22. Selected conductive pins are for connecting the module to sensors and low current, output loads such as microswitches, sensors, indicators and push button switches. Other pins are reserved for high current outputs such as DC motors and solenoids.

Snap fasteners generally shown at 24 are integrally formed with the molded lower assembly base 4 and snap fit over substrate surface 12 and function as a means for securely snap fitting substrate surface 12 to base 4.

Molded cavities 26 in the base 4 accommodate spring clips 28. Spring clips 28 connect the ground line at the bottom of the molded base 4 to the conductive traces located on the underside of substrate surface 12. Also, spring clips 30 located in cavities 32 connect the 5 wire bus with corresponding conductive traces also located on the underside of chip carrier 12.

When the module is snapped together, each spring clip is compressed so as to make secure contact with its corresponding conductive traces located on the underside of substrate surface 12. Since the spring clips are placed in compression when the module is fastened together by the snap fasteners 24, the spring clips will act as a release mechanism for the upper assembly 6 when the snap connection between the snap fasteners 24, and substrate surface 12 is removed.

As discussed above, there are locating elements for insuring the correct alignment and ease of positioning and fabrication of the component parts. In addition, these locating elements ease the fabrication of individual parts as well as facilitate the interconnection of the upper and lower assemblies. In particular, the substrate 12 has a positioning cavity 18 and pin holes 19 for locating the lower assembly 4 with respect to the upper assembly 6 in a horizontal direction. In particular, the circular cavity 18 mates with the cylindrically shaped post 34 on the base 4 and the pin holes 19 mate with pins 21. This engagement establishes the geometric relationship of the substrate surface 12 with respect to the walls 36 of the lower assembly 4, orienting the assemblies and restricting assembly movement. The interlocking relationship thus positions the upper assembly 6 in the horizontal direction with reference to the lower assembly 4.

The surface 12 includes depressed or cut out portions 20 for locating the upper assembly 6 with respect to the lower assembly 4 in a vertical direction. The cut out portions 20 are elongated strips along opposite sides of the substrate and the snap fasteners 24 of the lower assembly 4 are disposed for engaging the cut out portions 20. Also, the positioning cavity 18 is disposed essentially in the middle of one of the elongated strips.

In particular, the bottom surface 40 of the snap fasteners 24 engage the surfaces of the cut out portions 20. The degree or level of material cut away from the surface 12 determines the vertical distance or geometric relationship in the vertical direction of the upper assembly 6 from the lower assembly 4. This relationship determines the level of spring contact of the spring clips 28 and 30 against the underside of the chip carrier. The snap fasteners 24 include a molded, flexible portion 38 of the lower assembly.

As discussed above, the upper assembly 6 is a completely molded single piece including sets of molded pins 16 or pins staked into conductively plated cavities, the molded socket 8 for receiving the IC chip 14, and the molded location elements 18 and 20 for locating the second stage with respect to the first stage. The sets of molded pins 16 include applied conduction coatings for electrically connecting the input and the output devices to the IC chip 14 and the molded socket includes applied conductive traces 42 for electrically connecting the multi-wire bus to matching conductive traces 44 on the IC chip 14.

In accordance another feature of the present invention, the upper assembly 6 is a completely molded single piece including sets of molded pins 16, the molded socket 8 for receiving the IC chip 14, and the molded location elements 18 and 20 for locating the second stage with respect to the first stage. The sets of molded pins 16 include applied conductive coatings for electrically connecting the input and output devices to the IC chip 14 and the molded socket includes applied conductive traces 42 for electrically connecting the multi-wire bus to matching conductive traces 44 on the IC chip 14. The molded positioning elements locate the second state with respect to the first stage in both the horizontal and vertical directions.

In accordance with another feature of the present invention, there is provided in the molded socket 8, a polarization element 46. The upper assembly or second stage supports the IC chip 14 that includes the flexible contact tabs 44 as well as a polarizing corner 48. The molded socket includes polarizing element 46 to mate with the polarizing corner 48 and the conductive traces 42 engaging the contact tabs 44 for connecting the multi-wire bus and the input and output devices.

The polarizing element 46 mating with polarizing corner 48 ensures placement of the IC chip 14 in proper orientation with respect to the conductive traces. The contact tabs 44 engage the conductive traces for securing the IC chip within the molded socket. Thus the molded socket 8 is an essentially square opening in a top surface of the substrate and the polarizing element 46 a truncated corner of the opening. The polarizing corner 48 is a truncated portion of chip 14 adapted to mate with the truncated corner of the molded socket.

While there has been illustrated and described what is at present considered to be a preferred embodiment of the present invention, it will be appreciated that numerous changes and modifications are likely to occur to those skilled in the art, and it is intended in the appended claims to cover all those changes and modifications which fall within the true spirit and scope of the present invention.

We claim:

1. An input/output connector module for connecting at least one of an input device and an output device to a multi-wire bus, the bus carrying signals for controlling input and output devices, the module comprising:

a first stage having means for electrically connecting the first stage directly to the multi-wire bus, and a second stage supported on the first stage and having an IC chip mounted thereon, the second stage being a single molded element including a set of molded pins, the set of molded pins including applied conductive coatings for electrically connecting the input and output devices to the IC chip, a molded socket for receiving said IC chip, the molded socket including applied conductive traces for electrically connecting the multi-wire bus to the IC chip, and molded positioning elements for locating the second stage with respect to the first stage in both the horizontal and vertical directions, the second stage including a molded substrate having a molded positioning cavity for locating the second stage with respect to the first stage in the horizontal direction and the surface of the substrate including cut out portions for locating the second stage with respect to the first stage in the vertical direction, the second stage being adapted for connecting the multi-wire bus to the IC chip for conveying the signals between the multi-wire bus and the input and output devices.

2. A module according to claim 1 wherein the cut out portions are molded elongated strips along opposite sides of the substrate.

3. A module according to claim 2 wherein the positioning cavity is semi-circular and centered in the middle of one of the elongated strips.

4. An input/output connector module for connecting at least one of an input device and an output device to a multi-wire bus, the bus carrying signals for controlling input and output devices, the module comprising:

a first stage having means for electrically connecting the first stage directly to the multi-wire bus, and a second stage supported on the first stage and having an IC chip mounted thereon, the second stage being a single molded element including a set of molded pins being adapted for connecting the input and output devices to the IC chip, a molded socket for receiving said IC chip, and molded positioning elements for locating the second stage with respect to the first stage in both the horizontal and vertical directions, the second stage being adapted for connecting the multi-wire bus to the IC chip for conveying the signals between the multi-wire bus and the input and output devices.

5. A module according to claim 4 wherein the sets of molded pins include applied conductive coatings for electrically connecting the input and output devices to the IC chip.

6. A module according to claim 4 wherein the molded socket includes applied conductive traces for electrically connecting the multi-wire bus to the IC chip.

7. A module according to claim 4 wherein the second stage includes a molded substrate having a molded positioning cavity for locating the second stage with respect to the first stage in the horizontal direction and the surface of the substrate includes depressed portions for locating the second stage with respect to the first stage in the vertical direction.

8. A module according to claim 7 wherein the depressed portions are molded elongated strips along opposite sides of the substrate.

9. A module according to claim 8 wherein the positioning cavity is semi-circular and centered in the middle of one of the elongated strips.

10. An input/output connector module for connecting at least one of an input device and an output device to a multi-wire bus, the bus carrying signals for controlling input and output devices, the module comprising:

a first stage having means for electrically connecting the first stage directly to the multi-wire bus, and a second stage supported on the first stage and having an IC chip mounted thereon and input and output pins staked into conductively plated cavities, the second stage being a single molded element including a molded socket for receiving said IC chip and molded positioning elements for locating the second stage with respect to the first stage in both the horizontal and vertical directions, the second stage being adapted for connecting the multi-wire bus to the IC chip for conveying the signals between the multi-wire bus and the input and output devices.

11. A module according to claim 10 wherein the sets of staked pins electrically connect the input and output devices to the IC chip.

12. An input/output connector module for connecting at least one of an input device and an output device to a multi-wire bus, the bus carrying signals for controlling input and output devices, the module comprising:

a first stage having means for electrically connecting the first stage directly to the multi-wire bus, and a second stage supported on the first stage and having an IC chip mounted thereon, the second stage being a single molded element including a molded socket for receiving said IC chip and molded positioning elements for locating the second stage with respect to the first stage in both perpendicular and horizontal directions, the second stage being adapted for connecting the multi-wire bus to the IC chip for conveying signals between the multi-wire bus and the input and output devices.

13. A module according to claim 12 including molded pins adapted for connecting the input and output devices to the IC chip.

14. A module according to claim 13 wherein the molded pins include applied conductive coatings.

15. A module according to claim 12 including staked pins for connecting the input and output devices to the IC chip.

16. A module according to claim 13 wherein the sets of molded pins include applied conductive coatings for electrically connecting the input and output devices to the IC chip.

17. A module according to claim 12 wherein the molded socket includes applied conductive traces for electrically connecting the multi-wire bus to the IC chip.

18. A module according to claim 12 wherein the second stage includes a molded substrate having a molded positioning cavity for locating the second stage with respect to the first stage in a first direction and the surface of the substrate includes cut out portions for locating the second stage with respect to the first stage in a second direction.

19. A module according to claim 18 wherein the cut out portions are molded elongated strips along opposite sides of the substrate.

20. A module according to claim 18 wherein the molded positioning cavity is semi-circular and centered in the middle of one of the elongated strips.

* * * * *